(12) United States Patent
Koshiba et al.

(10) Patent No.: US 12,331,754 B2
(45) Date of Patent: Jun. 17, 2025

(54) AXIAL FAN MOTOR

(71) Applicant: MINEBEA MITSUMI Inc., Nagano (JP)

(72) Inventors: Toshikazu Koshiba, Nagano (JP); Tomoyuki Suzuki, Nagano (JP); Yuji Omura, Nagano (JP); Mitsuhiko Takahashi, Nagano (JP); Hiroyuki Kato, Nagano (JP)

(73) Assignee: MINEBEA MITSUMI Inc., Nagano (JP)

( * ) Notice: Subject to any disclaimer, the term of this patent is extended or adjusted under 35 U.S.C. 154(b) by 0 days.

(21) Appl. No.: 18/688,958

(22) PCT Filed: Apr. 20, 2022

(86) PCT No.: PCT/JP2022/018276
§ 371 (c)(1),
(2) Date: Mar. 4, 2024

(87) PCT Pub. No.: WO2023/032348
PCT Pub. Date: Mar. 9, 2023

(65) Prior Publication Data
US 2024/0369069 A1  Nov. 7, 2024

(30) Foreign Application Priority Data

Sep. 6, 2021  (JP) .................................. 2021-144522

(51) Int. Cl.
*F04D 29/42* (2006.01)
*F04D 19/00* (2006.01)
*F04D 25/06* (2006.01)

(52) U.S. Cl.
CPC ....... *F04D 29/4226* (2013.01); *F04D 19/002* (2013.01); *F04D 25/0633* (2013.01)

(58) Field of Classification Search
CPC .......................... F04D 29/4226; F04D 19/002
See application file for complete search history.

(56) References Cited

U.S. PATENT DOCUMENTS 9,957,965 B2 *  5/2018  Yamagata ............. F04D 19/002
2010/0117468 A1  5/2010  Kurita
(Continued)

FOREIGN PATENT DOCUMENTS

| JP | 05-17438 Y2 | 5/1993 |
|---|---|---|
| JP | 2010-196574 A | 9/2010 |
| WO | 2008/041353 A1 | 4/2008 |

OTHER PUBLICATIONS

International Search Report for corresponding International Application No. PCT/JP2022/018276 mailed Jun. 28, 2022.
(Continued)

*Primary Examiner* — Michael L Sehn
(74) *Attorney, Agent, or Firm* — Chrisman Gallo Tochtrop LLC

(57) ABSTRACT

To provide an axial fan motor increasing the mounting area of a circuit board and further improving heat dissipation as compared with the axial fan motor in the related art. A fan device as an axial fan motor includes: a casing having a hollow tubular shape and provided with an intake opening at one end in an axial direction and an exhaust opening at another end in the axial direction; an impeller including a plurality of blades and accommodated in the casing; a motor accommodated in the casing and configured to rotate the impeller; and a plurality of circuit boards arranged along the axial direction at a side close to exhaust opening in the casing.

14 Claims, 9 Drawing Sheets

(56) References Cited

U.S. PATENT DOCUMENTS

2010/0215527 A1    8/2010  Suzuki et al.
2016/0097396 A1    4/2016  Yamagata et al.

OTHER PUBLICATIONS

Written Opinion for corresponding International Application No. PCT/JP2022/018276 dated Jun. 28, 2022 and English translation.

* cited by examiner

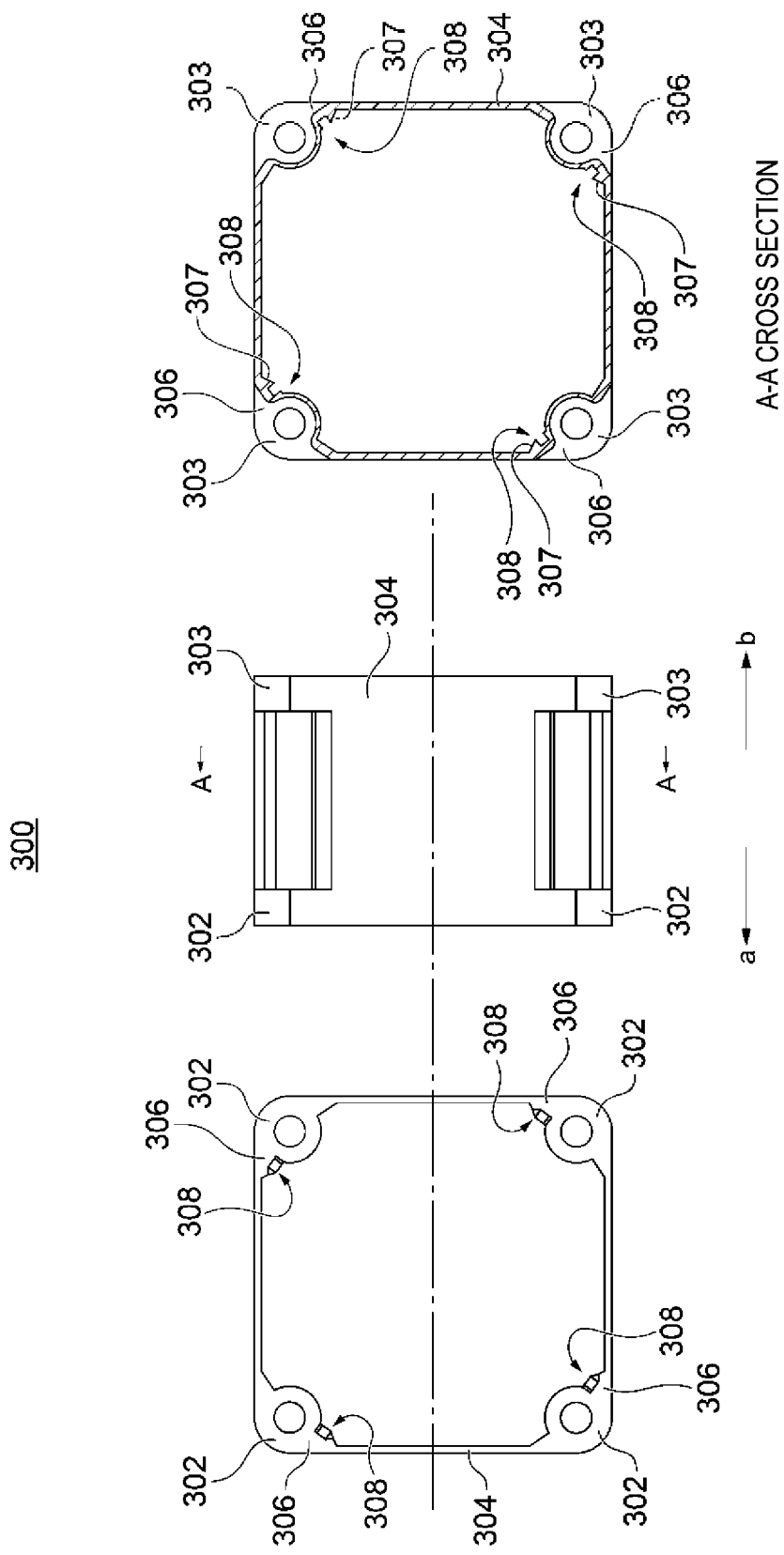

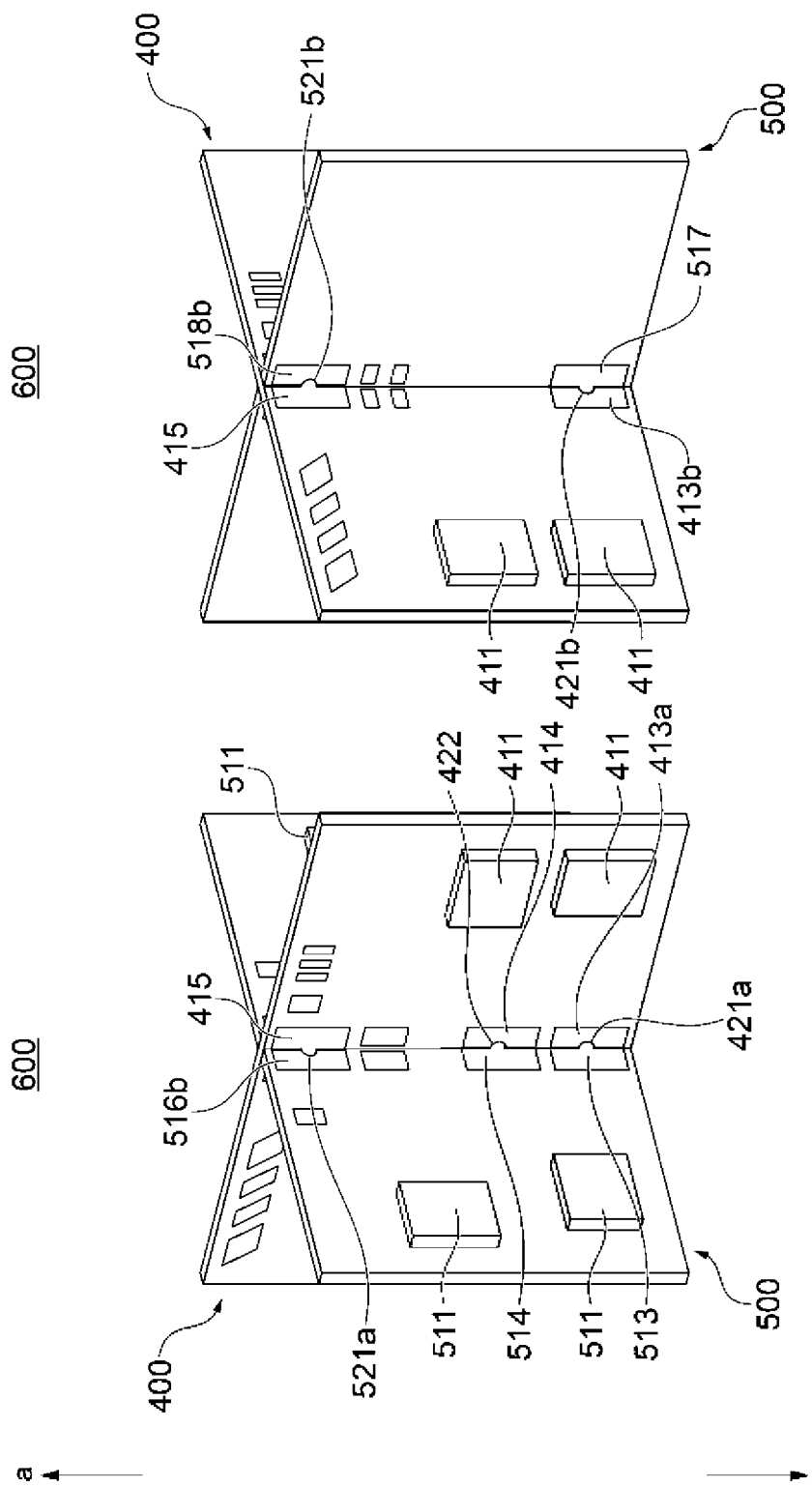

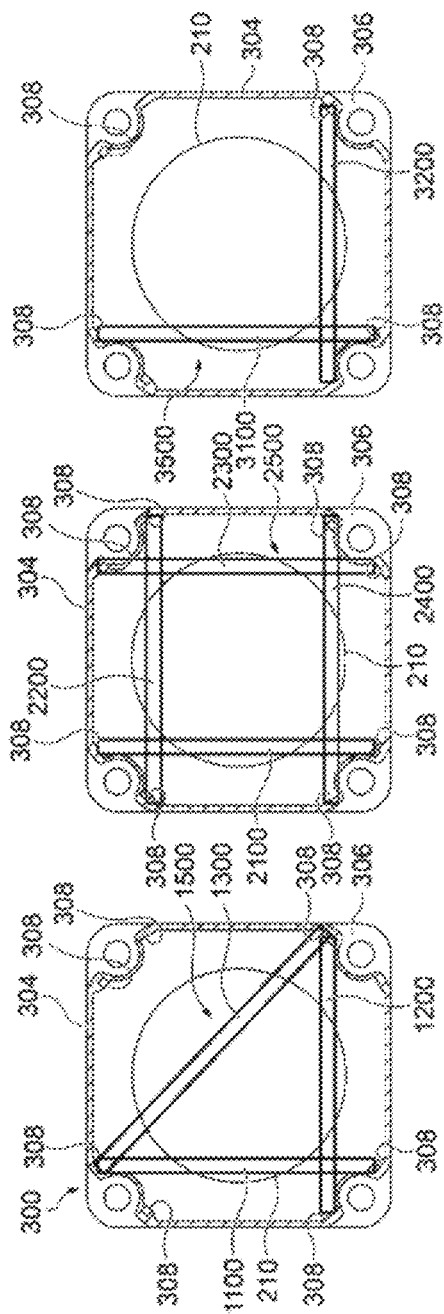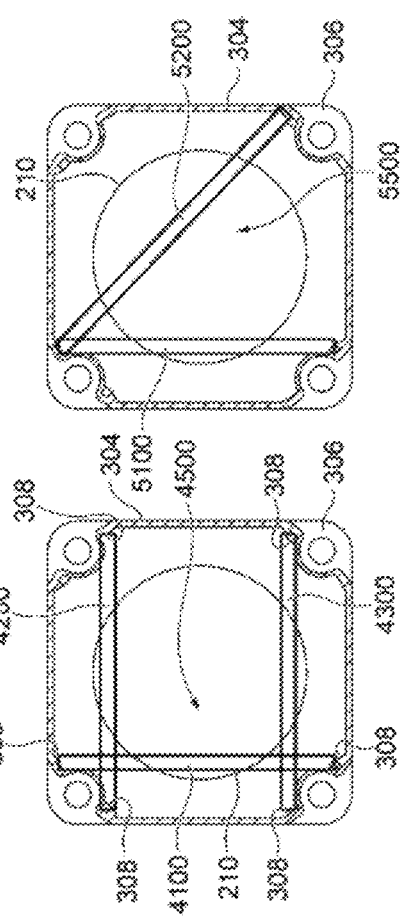

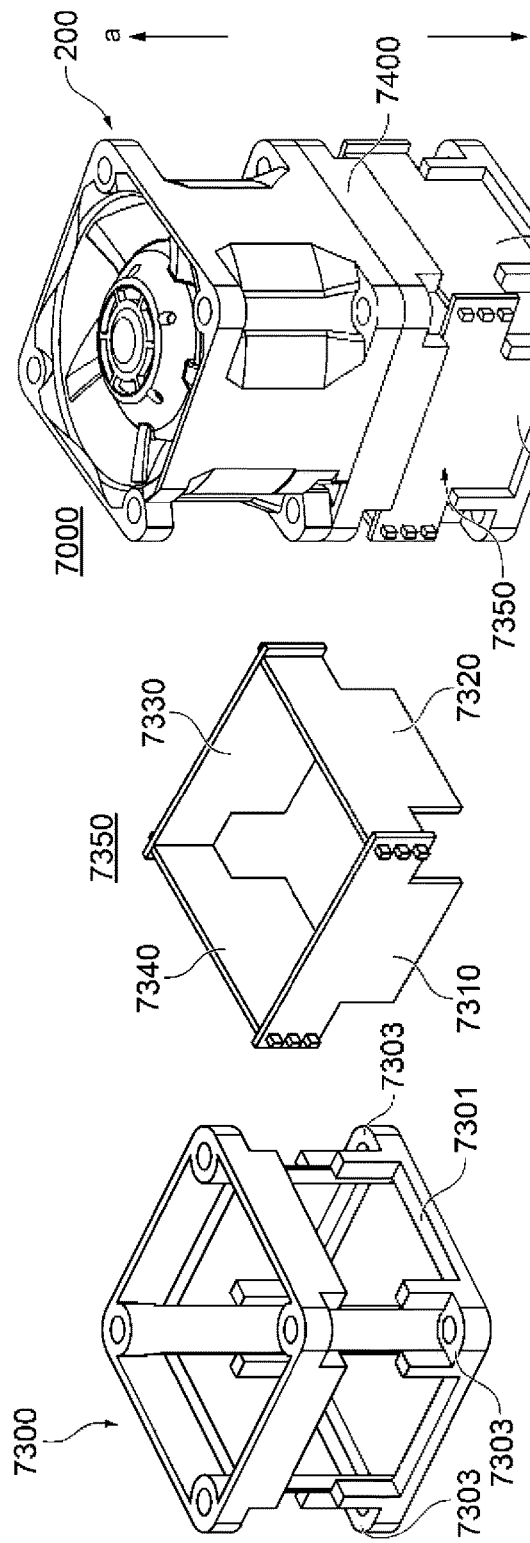
FIG. 9A
FIG. 9B
FIG. 9C
FIG. 9D
FIG. 9E

AXIAL FAN MOTOR

CROSS REFERENCE TO RELATED APPLICATIONS

This application is a national stage entry of International Application No. PCT/JP2022/018276, filed on Apr. 20, 2022, which claims priority to Japanese Patent Application 2021-144522, filed on Sep. 6, 2021, which is incorporated herein by reference.

TECHNICAL FIELD

The disclosure relates to an axial fan motor.

BACKGROUND

In recent years, as the performance of an information apparatus has improved, the power consumption of electronic components inside the information apparatus has been increasing. In accordance with this, for example, a fan used for cooling electronic components disposed at an information apparatus such as a server requiring high output and high functionality, is obviously required to improve cooling performance by increasing output. Thus, it is necessary to cool the heat in the control board caused by the concentration of electric power to the control board driving the high-output fan.

With this issue, in the related art, a fan motor is disclosed (e.g., see WO 2008/041353) having a structure. In the structure, the control board is lined substantially parallel to the rotation center axis of the fan so as to be disposed in an air flow flowing from an intake opening to an exhaust opening of a frame by a rotating blade, and thus the air flow hits all or part of the control board.

SUMMARY

However, since the control board described in Patent Document 1 is formed of a single plate having a T-shape, and the upper limit of the mounting area is determined depending on the size of the fan, the mounting area cannot be further increased, and this may make it difficult to achieve the higher output of the fan.

Further, since the mounting area of the control board cannot be further increased, there is a limit to increase the size of the extension portion as well, and thus, all of the electronic components generating a large amount of heat cannot be installed in the extension portion, making it difficult to further improve heat dissipation.

The disclosure has been made in view of the above background, and it is an object of the disclosure to provide an axial fan motor for increasing the mounting area of the circuit board and further improving the heat dissipation as compared with the axial fan motor in the related art.

The above issues are solved by the disclosure described below. That is, an axial fan motor of the disclosure includes: a casing having a hollow tubular shape and provided with an intake opening at one end in an axial direction and an exhaust opening at another end in the axial direction; an impeller accommodated in the casing and including a plurality of blades; a motor accommodated in the casing and configured to rotate the impeller; and a plurality of circuit boards arranged along the axial direction at a side close to the exhaust opening in the casing.

According to the disclosure, it is possible to achieve an axial fan motor configured to increase the mounting area of the circuit board and further improve heat dissipation as compared with the axial fan motor in the related art.

BRIEF DESCRIPTION OF DRAWINGS

FIGS. 4A to 4C are a top view (FIG. 4A), a side view (FIG. 4B), and an A-A cross-sectional view (FIG. 4C) in FIG. 4B illustrating a configuration of a lower casing of a fan device according to an embodiment of the disclosure.

FIGS. 6A and 6B are perspective views illustrating a state with two circuit boards joined in a fan device according to an embodiment of the disclosure.

FIGS. 8A to 8E are bottom views illustrating a pattern of arrangement of a circuit board being attached to a lower casing, according to other embodiments of the disclosure.

FIGS. 9A to 9E are perspective views illustrating a configuration of a fan device with four circuit boards forming a side wall, according to another embodiment of the disclosure.

DESCRIPTION OF EMBODIMENTS

Embodiments

Figure 1:
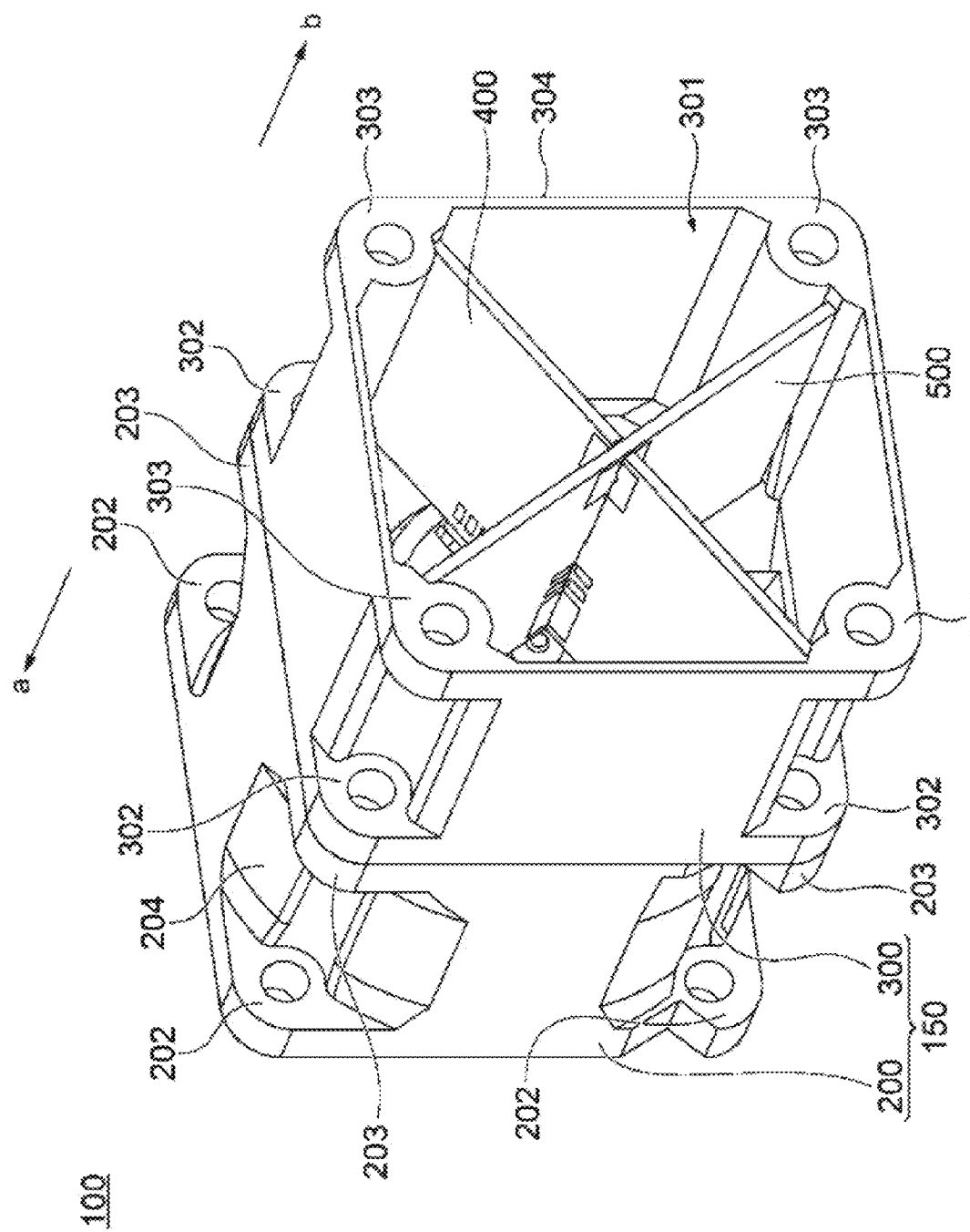
FIG. 1 is a perspective view illustrating an overall configuration of a fan device according to an embodiment of the disclosure.
Figures 2A, 2B:
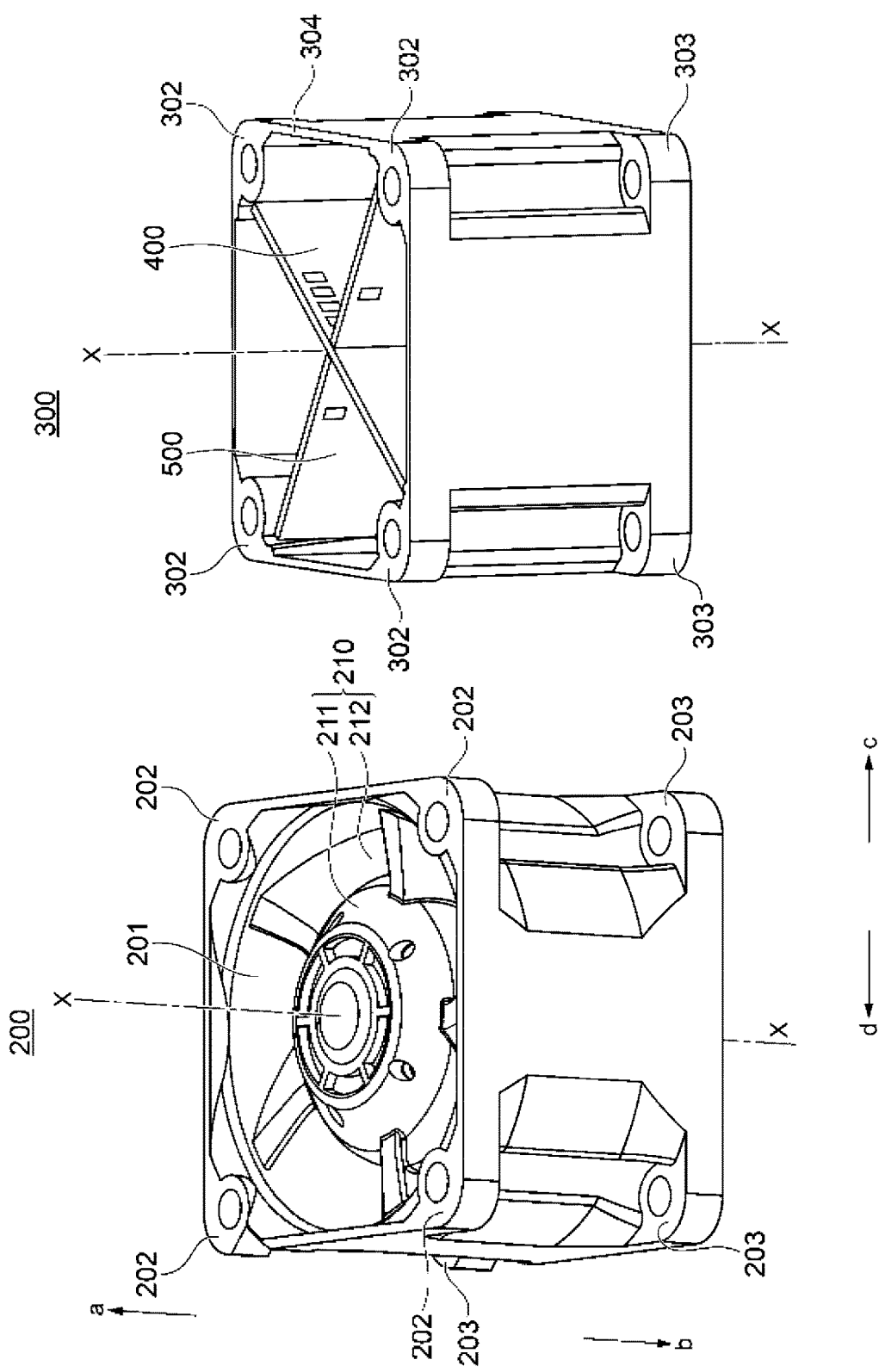
FIGS. 2A and 2B are perspective views illustrating configurations of an upper casing and a lower casing of a fan device according to an embodiment of the disclosure.
Figure 3:
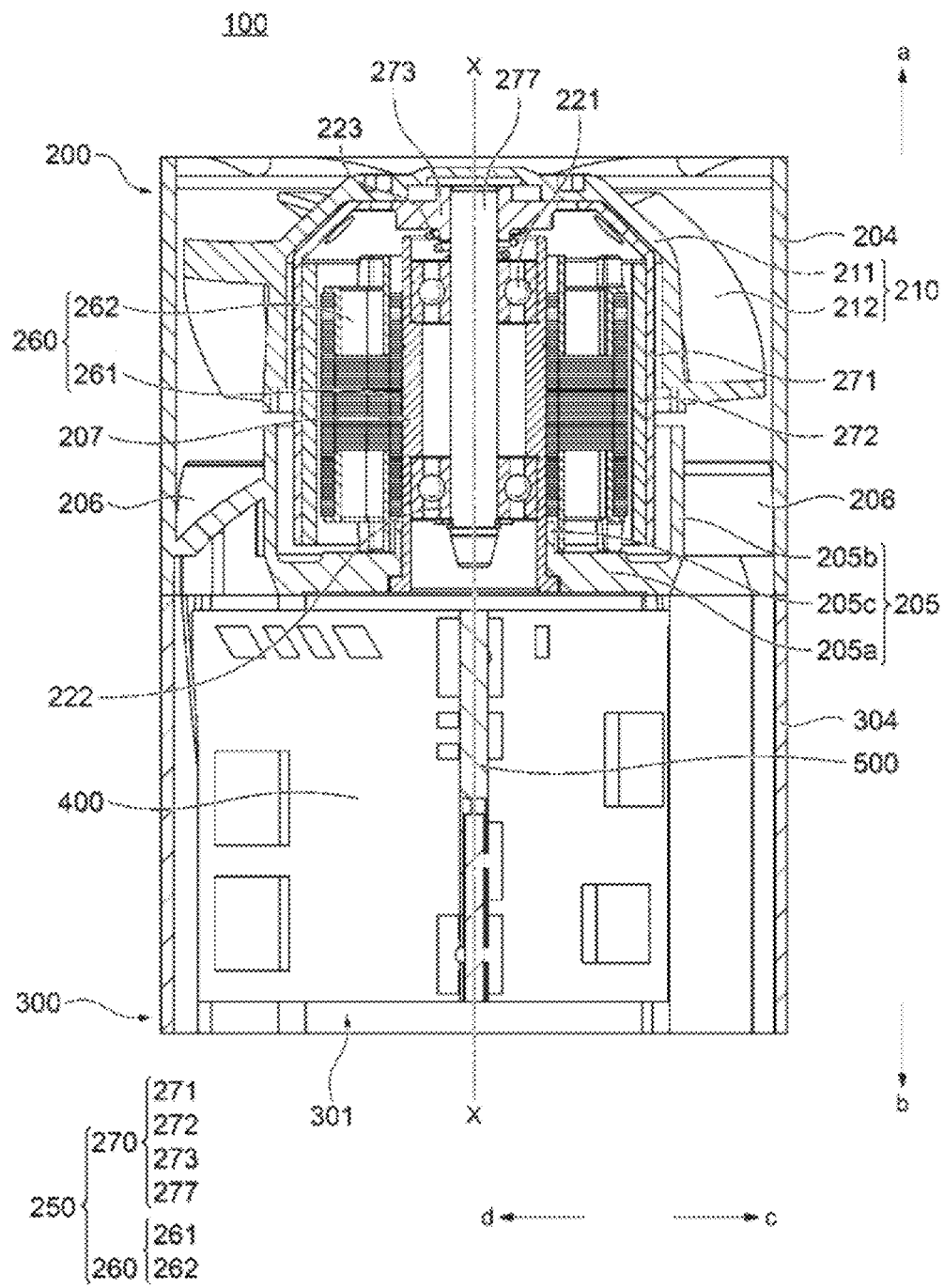
FIG. 3 is a cross-sectional view illustrating a configuration of a drive portion in a fan device according to an embodiment of the disclosure.
Figures 5A, 5B:
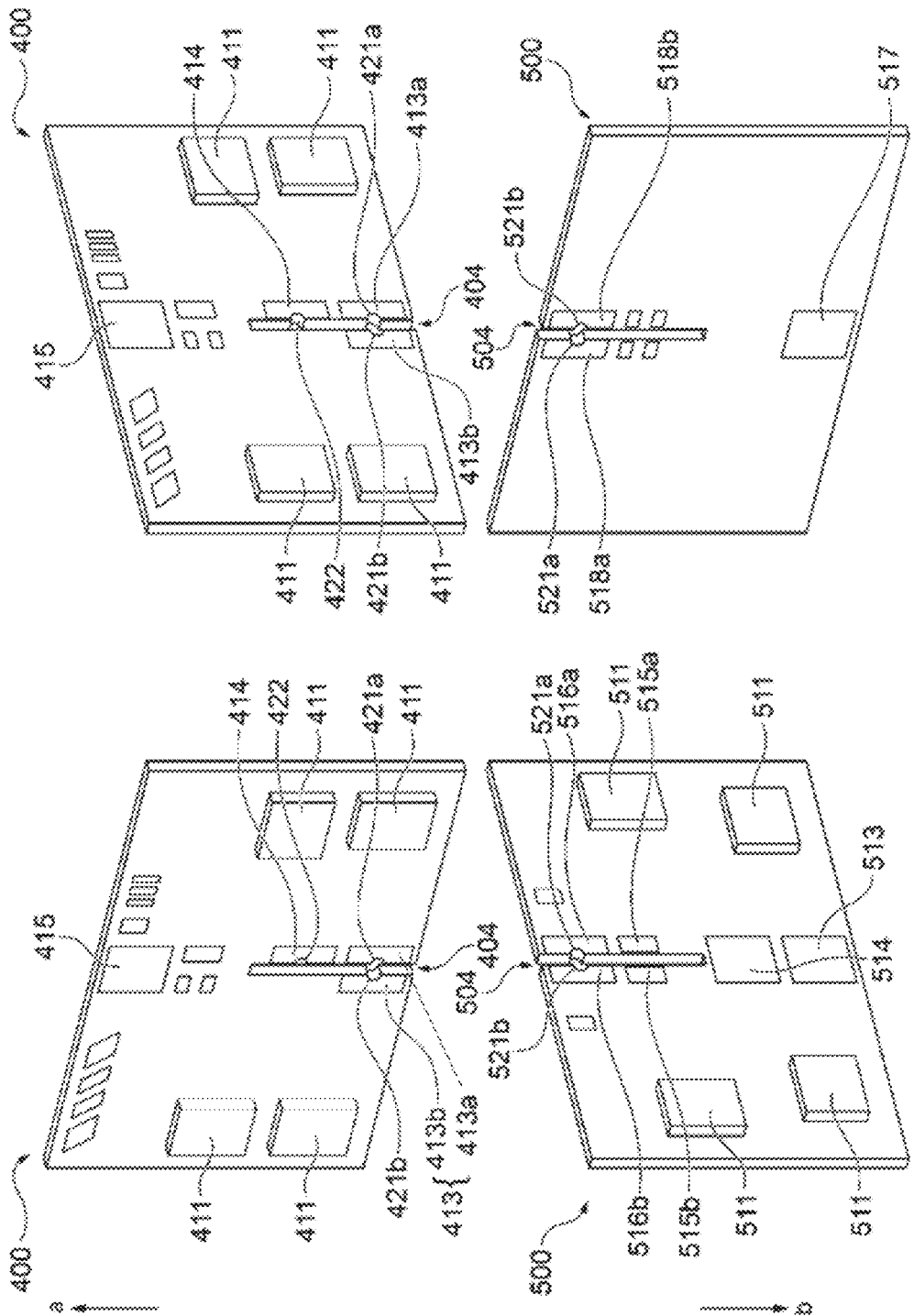
FIGS. 5A and 5B are exploded perspective views illustrating a configuration of two circuit boards in a fan device according to an embodiment of the disclosure.
Figure 7:
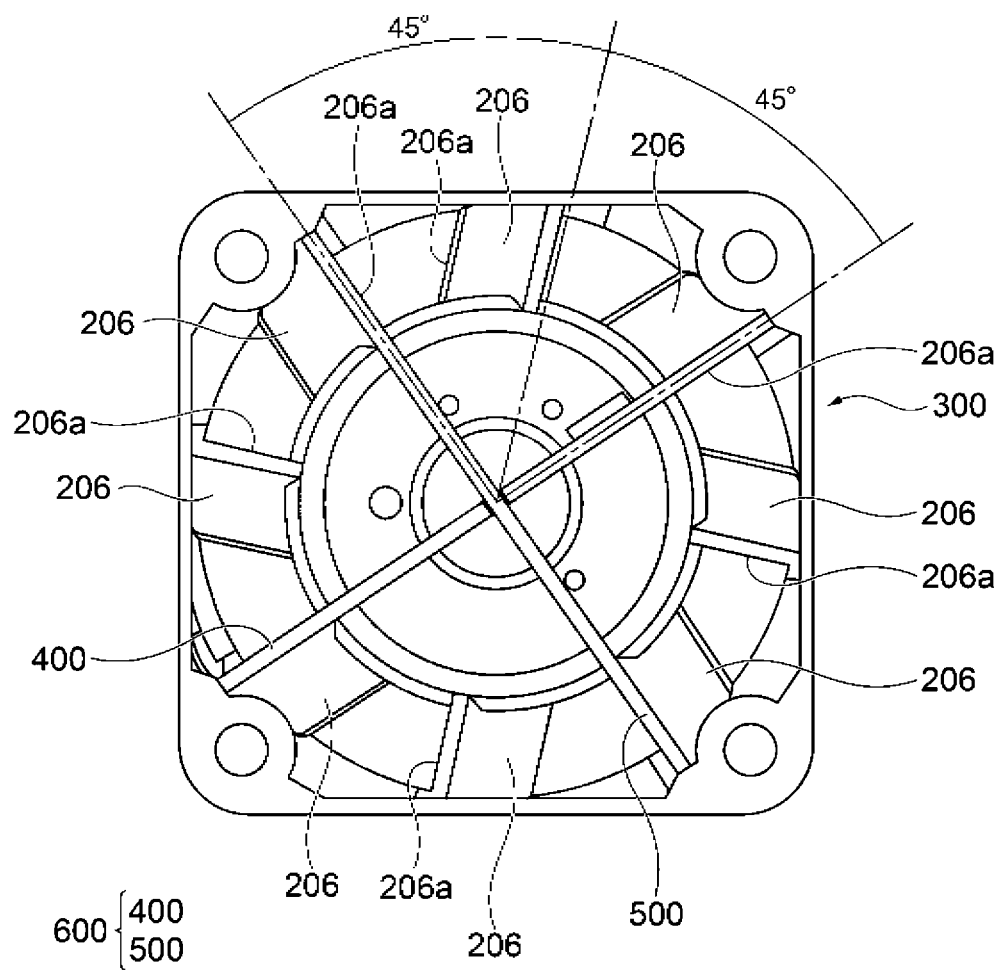
FIG. 7 is a bottom view illustrating a state with two circuit boards attached to a lower casing in a fan device according to an embodiment of the disclosure.

Embodiments of the disclosure will now be described with reference to FIG. 1 to FIG. 7. FIG. 1 is a perspective view illustrating an overall configuration of a fan device according to an embodiment of the disclosure. FIGS. 2A and 2B are perspective views illustrating configurations of an upper casing and a lower casing of a fan device according to an embodiment of the disclosure. FIG. 3 is a cross-sectional view illustrating a configuration of a drive portion in a fan device according to an embodiment of the disclosure. FIGS. 4A to 4C are a top view (FIG. 4A), a side view (FIG. 4B), and an A-A cross-sectional view (FIG. 4C) in FIG. 4B illustrating a configuration of a lower casing of a fan device according to an embodiment of the disclosure. FIGS. 5A and 5B are exploded perspective views illustrating a configuration of two circuit boards in a fan device according to an embodiment of the disclosure. FIGS. 6A and 6B are perspective views illustrating a state with two circuit boards joined in a fan device according to an embodiment of the disclosure. FIG. 7 is a bottom view illustrating a state with two circuit boards attached to a lower casing in a fan device according to an embodiment of the disclosure.

In the description of embodiments of the disclosure, for convenience of description, an arrow a direction along an axis X is defined to be an upper side or upward direction. The upper side or upward direction means an intake opening side. An arrow b direction along the axis X is defined to be a lower side or downward direction. The lower side or downward direction means an exhaust opening side. Here, arrows a and b directions are referred to as a vertical direction, but does not necessarily correspond to the vertical direction in the direction of gravity. An arrow c direction away from the axis X is referred to as an outer peripheral side, an arrow d direction approaching the axis X is referred to as an inner peripheral side, and the arrow c and d directions are referred to as a radial direction.

A fan device 100 as an axial fan motor according to an embodiment of the disclosure is an axial blower for blowing air flow in an axis X direction. The fan device 100 includes a casing 150 with an upper casing 200 and a lower casing 300 integrally coupled. The upper casing 200 and the lower casing 300 are coupled to each other along the axis X direction.

The upper casing 200 has a tubular shape substantially square in plan view and includes an intake opening 201 for sucking air from an upper side (arrow a direction) of the axis X direction into a hollow cylindrical wind tunnel part. The upper casing 200 accommodates an impeller 210 composed of a hub 211 and a blade 212, and a motor 250 (FIG. 3) for rotating and driving the impeller 210.

The upper casing 200 includes four upper flange parts 202 at upper corners (arrow a direction) and four lower flange parts 203 at lower corners (arrow b direction). These upper flange parts 202 and lower flange parts 203 are provided with penetrating holes inserting a bolt (not illustrated) for attachment to a predetermined apparatus or housing.

The upper casing 200 includes a side wall 204 surrounding the impeller 210 in the radial direction (arrow c and d directions), a motor base part 205 formed at the exhaust opening side, the lower end in the axis X direction, and a fixed blade 206 composed of a plurality of stationary blades coupling the side wall 204 and the motor base part 205 in the radial direction (arrow c and d directions).

The side wall 204, the motor base part 205, and the plurality of fixed blades 206, of the upper casing 200 are integrally formed by injection molding of a synthetic resin (e.g., a polybutylene terephthalate resin (containing glass fibers)). Instead of the fixed blades 206 connecting the side wall 204 and the motor base part 205, a plurality of spokes composed of rod-like portions may be used.

The side wall 204 constituting the wind tunnel part of the upper casing 200 has a cylindrical shape centered at the axis X and has an inner diameter not coming into contact with an outer peripheral end of the blade 212 of the impeller 210. That is, a predetermined gap is formed between the outer peripheral end of the blade 212 of the impeller 210 and an inner peripheral surface of the side wall 204.

The side wall 204 of the upper casing 200 also functions as a guard part to protect the impeller 210. At the upper side (arrow a direction) and lower side (arrow b direction) of the outer peripheral side of the side wall 204, four upper flange parts 202 and four lower flange parts 203 are integrally formed with the side wall 204.

The motor base part 205 is formed of a disc-shaped base part 205a, a cylindrical outer peripheral wall 205b extending from the outer peripheral end part of the base part 205a to the upper side (arrow a direction) along the axis X by a predetermined length, and a boss part 205c projecting from the inner peripheral end of the base part 205a to the upper side (arrow a direction) along the axis X by a predetermined length.

The plurality of fixed blades 206 described above are integrally formed at the outer peripheral surface of the outer peripheral wall 205b in the motor base part 205. That is, the outer peripheral wall 205b at the motor base part 205 is supported by the side wall 204 of the upper casing 200 through the plurality of fixed blades 206.

A bearing housing 207 made of a hollow cylindrical metal material is press-fitted into an inner peripheral surface of the boss part 205c at the motor base part 205. The bearing housing 207 is press-fitted into the boss part 205c, but may be integrally formed with the motor base part 205 with the bearing housing 207 inserted into the boss part 205c.

A stator part 260 is disposed at the outer peripheral surface of the bearing housing 207. However, this is not limited, and the stator part 260 may be attached directly to the motor base part 205 without bearing housing 207.

At an inner peripheral surface of the bearing housing 207, step parts are provided on the upper side (arrow a direction) and the lower side (arrow b direction) in the axis X direction, and bearings 221 and 222 are fitted to the step parts at the upper side (arrow a direction) and the lower side (arrow b direction). The bearings 221 and 222 are, for example, ball bearings. The bearings 221 and 222 are not limited to ball bearings, and various other bearings, such as sleeve bearings, may be used.

The bearing 221 rotatably supports the upper side (arrow a direction) in the axis X direction with respect to a shaft 277 of a rotor part 270, and a bearing 222 rotatably supports the lower side (arrow b direction) in the axis X direction with respect to the shaft 277. Thus, the shaft 277 of the rotor part 270 is rotatably supported with respect to the stator part 260.

The motor 250 is, for example, a single-phase brushless DC motor, and is composed of the stator part 260 and the rotor part 270. The stator part 260 includes a stator core 261 formed by a stacked body with a plurality of cores of an electromagnetic steel plate stacked, the electromagnetic steel plate being made of a soft magnetic material, an insulator 262 made of an in insulating material mounted at the stator core 261, and a coil wound around the stator core 261 through the insulator 262.

Since the coil (not illustrated) is wound around the stator core 261 through the insulator 262, the stator core 261 and the coil are insulated by the insulator 262. Note that the motor 250 is not limited to the single-phase brushless DC motor, but other motors such as a three-phase brushless DC motor can be used.

In the stator core 261, the outer peripheral surface of the bearing housing 207 is fitted to an inner peripheral surface forming a circular opening part. That is, the stator core 261 is attached to the bearing housing 207. However, this is not limited, and the stator core 261 may be attached to the bearing housing 207 by using an adhesive together.

The rotor part 270 is composed of a rotor yoke 271 having a hollow cylindrical shape and made of a soft magnetic material, an annular magnet 272 disposed at the inner peripheral surface of the rotor yoke 271, and a shaft 277 disposed coaxially with the rotor yoke 271 and the magnet 272 and coupled to the hub 211 described below via a bush 273. For reference, the rotor yoke 271 may be configured without using the bush 273.

The inner peripheral edge of the rotor yoke 271 is integrally fixed to the outer peripheral edge of the bush 273 by caulking. The shaft 277 is press-fitted into the bush 273. The rotor yoke 271, magnet 272, and shaft 277 are integrated through the hub 211, and the shaft 277 is integrated with the hub 211 through the bush 273. That is, the impeller 210 is integrated with the rotor yoke 271 of the rotor part 270.

The impeller 210 is provided with the hub 211 having a cup shape with a bottom and a cross section substantially in an inverted U-shape and a plurality of blades 212 provided along the circumferential direction at the outer peripheral surface of the hub 211. The hub 211 and the plurality of blades 212 are integrally formed by injection molding of a synthetic resin (e.g., polybutylene terephthalate resin (containing glass fibers)).

The hub 211 of the impeller 210 is integrally bonded, by an adhesive, to the outer peripheral surface of the upper side (arrow a direction) of the rotor yoke 271 having a hollow cylindrical shape. However, this is not limited, and the rotor yoke 271 may be inserted into the hub 211 to integrally form the inner peripheral surface of the hub 211 and the outer peripheral surface of the rotor yoke 271. That is, the hub 211 and the rotor yoke 271 are integrally formed.

The plurality of blades 212 all have the same shape and are evenly spaced at equal gaps in the circumferential direction of the hub 211. Thus, the rotor part 270 is integrated with the blades 212 by the hub 211 integrated with the rotor yoke 271 and functions as a rotating body. Thus, when the rotor yoke 271 rotates around the shaft 277 by the electromagnetic action of the stator part 260 and the rotor part 270, the impeller 210 rotates together with the rotor yoke 271, constituting an outer rotor motor.

In addition, the hub 211 covers an upper (arrow a direction) end part of the shaft 277 to prevent foreign matters from entering from the outside. For reference, a coil spring 223 is interposed for preloading the bearing 221, between the hub 211 of the impeller 210 and the bearing 221 fitted to the upper side (arrow a direction) in the axis X direction.

The lower casing 300 has a substantially square tubular shape in plan view and includes an exhaust opening 301, at an inner side of a side wall 304 forming the square, for discharging air from the lower side (arrow b direction) in the axis X direction. The lower casing 300 accommodates two circuit boards 400 and 500 for driving and controlling the motor 250 accommodated in the upper casing 200.

Like the upper casing 200, the lower casing 300 also includes four upper flange parts 302 at upper corners (arrow a direction) and four lower flange parts 303 at lower corners (arrow b direction).

These upper flange parts 302 and lower flange parts 303 are provided with penetrating holes for inserting bolts (not illustrated) for attachment to a predetermined apparatus or housing. The lower casing 300 is also integrally formed by injection molding of a synthetic resin (e.g., polybutylene terephthalate resin (containing glass fibers)).

In practice, the upper casing 200 and the lower casing 300 are formed separately, and then the penetrating holes of the lower flange parts 203 of the upper casing 200 and the penetrating holes of the upper flange parts 302 of the lower casing 300 are oppositely disposed and brought into contact with each other, so that the upper casing 200 and the lower casing 300 are coupled by fasteners such as bolts through these penetrating holes. Thus, the casing 150 composed of the upper casing 200 and the lower casing 300 is formed. However, the casing 150 may be formed integrally by molding.

As illustrated in FIGS. 4A to 4C, in the lower casing 300, in order to form the penetrating holes of the upper flange parts 302 and the penetrating holes of the lower flange parts 303, thick portions 306 thicker than the side wall 304 are formed around these respective penetrating holes. A thick portion 306 is a portion of the side wall 304 and formed between the penetrating hole and the side wall 304.

The thick portions 306 of the side wall 304 are each formed with a groove (hereafter called "board insertion groove") 308 capable of holding the circuit boards 400 or 500 inserted into the groove. A board insertion groove 308 is formed parallel along the axis X so as to reach from the upper flange part 302 to the lower flange part 303 near the corners of the lower casing 300.

The board insertion groove 308 is formed of a rectangular recess portion consistent with the end part shape of a circuit board 400 or 500, and extends in the vertical direction (arrow a and b directions) along the axis X at a predetermined depth. Among the plurality of board insertion grooves 308, the board insertion grooves 308 existing on the diagonal of the lower casing 300 are disposed to oppose each other, and the circuit boards 400 and 500 can be each held by the two board insertion grooves 308 facing each other.

In the board insertion groove 308, a protruding wall 307 protruding toward the axis X with respect to the thick portion 306 thicker than the side wall 304 is formed by injection molding. The board insertion groove 308 is formed at only one place near the penetrating hole of the thick portion 306 of the side wall 304, but may be formed at two places on both sides of the penetrating hole at the thick portion 306.

For reference, although the side wall 304 of the lower casing 300 is a thin plate-like portion, forming the thick portion 306 prevents the strength from being reduced by thinning.

As illustrated in FIGS. 5A and 5B and FIGS. 6A and 6B, the circuit boards 400 and 500 have the same board size and board shape. The circuit boards 400 and 500 are a printed circuit board formed in a rectangular shape in plan view and include a plurality of wiring layers mounting various electronic components 411 and 511 constituting a motor drive control circuit (not illustrated) for rotationally driving the motor 250. However, this is not limited, and the circuit boards 400 and 500 may be single-layer printed circuit boards.

The motor drive control circuit is a circuit for controlling the rotation of the motor 250. The motor drive control circuit is achieved by various electronic components 411 and 511 being mounted at the circuit boards 400 and 500 and electrically connected to the motor 250. The motor drive control circuit includes, for example, a control circuit for generating a control signal for controlling the rotation of the motor 250 and an inverter circuit for driving the motor 250 based on the control signal.

A slit 404 is formed at the center in the longitudinal direction of the rectangular shape of the circuit board 400, the slit 404 being formed by cutting to a half height from the lower side (arrow b direction) to the upper side (arrow a direction) in the vertical direction (arrow a and b directions). This allows wiring to be connected at portions not being formed with the slit, thus ensuring sufficient wiring for connecting the left and right boards when the slit is centered, compared to when the slit is provided at half height or higher. The width of the slit 404 is equal to or slightly larger than the board thickness of a circuit board 500.

Similarly, a slit 504 formed by cutting to a half height from the upper side (arrow a direction) to the lower side (arrow b direction) in the vertical direction (arrow a and b directions) is formed at the center in the longitudinal direction of the rectangular shape of the circuit board 500. The width of the slit 504 is equal to or slightly larger than the board thickness of the circuit board 400.

The slit 404 of the circuit board 400 and the slit 504 of the circuit board 500 are slidably engaged with each other to be integrally combined and joined. In this case, the slit 404 of the circuit board 400 is half the length in the vertical direction (arrow a and b directions), and the slit 504 of the circuit board 500 is also half the length in the vertical direction (arrow a and b directions). Thus, the circuit boards 400 and 500 have excellent strength balance when combined, and the reduction in the board mounting area due to the presence of the slit portion is minimized.

The circuit board 400 includes rectangular planar pads 413 to 415 as surfaces for soldering. The planar pad 413 includes one side pad 413a and the other side pad 413b formed across the slit 404 longitudinally.

The planar pad 414 is provided at the upper side (arrow a direction) of the planar pad 413 (413a, 413b) and is formed only at one side of the slit 404. The planar pad 415 is formed at the upper side (arrow a direction) of the slit 404 and at the upper end part of the circuit board 400.

Two kinds of the planar pad 413 (413a, 413b) and the planar pad 414 are provided for one slit 404. This is because signals flowing at the planar pad 413 and the planar pad 414 are different from each other. Thus, when the signals flowing are the same, only one planar pad 413 (413a, 413b) or the planar pad 414 may be used.

The circuit board 400 includes through-holes 421a and 421b around the slit 404. The through-holes 421a and 421b are each composed of a recess portion having a semicircular cross section formed to oppose each other with the slit 404 in between, to improve conductivity between the layers. The through-holes 421a and 421b are superposed on the one side pad 413a and the other side pad 413b, respectively. Each of the through-holes 421a and 421b is a recess portion having a semicircular cross section and penetrates through the circuit board 400, thereby spatially communicating with the slit 404.

The circuit board 400 includes a through-hole 422 above the through-hole 421a, and the through-hole 422 is composed of a recess portion having a semicircular cross section and communicating with the slit 404. The through-hole 422 is superposed on the planar pad 414 around the slit 404 and has the same structure as the through-hole 421a. The inner peripheral surfaces of the through-holes 421 (421a, 421b) and 422 are coated with a conductive material such as a copper film.

Thus, the circuit board 400 has the planar pads 413 (413a, 413b) and 414 provided with the through-holes 421 (421a, 421b) and 422, and the planar pad 415 not provided with the through-holes. The difference between the presence and absence of the through-hole is determined by the magnitude of the current flowing through the planar pads 413 to 415. When the current is large, the through-holes 421 and 422 are provided to ensure high conductivity.

In the circuit board 400, a plurality of electronic components 411 are mounted to both end parts in the longitudinal direction along the vertical direction (arrow a and b directions). This is because the heat dissipation effect is improved when the electronic components 411 are disposed in the exposed state in the air flow channel generated by the blades 212 of the impeller 210.

The circuit board 500 includes rectangular planar pads 513 to 518 as surfaces for soldering. The planar pads 513 and 514 provided at the surface of the circuit board 500 are formed so as to line in the vertical direction (arrow a and b directions) at the lower side (arrow b direction) of the slit 504. In the circuit board 500, the front surface of the circuit board 500 is illustrated in FIG. 5A, and the back surface of the circuit board 500 is illustrated in FIG. 5B.

The planar pad 515 includes a one side pad 515a and the other side pad 515b formed around the slit 504 across the slit 504 longitudinally. Similarly, the planar pad 516 includes a one side pad 516a and the other side pad 516b formed across the slit 504 longitudinally.

The planar pad 517 provided at the back surface of the circuit board 500 is formed at the lower side (arrow b direction) of the slit 504 and at the lower end part of the circuit board 500. The planar pad 518 provided at the back surface of the circuit board 500 includes a one side pad 518a and the other side pad 518b disposed at the upper end part of the circuit board 500 and formed across the slit 504 longitudinally.

The circuit board 500 includes through-holes 521a and 521b. The through-holes 521a and 521b are each composed of a recess portion having a semicircular cross section formed to oppose each other with the slit 504 in between, to improve conductivity between the layers of the conductor pattern.

The through-holes 521a and 521b are superposed on the one side pad 516a and the other side pad 516b provided at the front surface of the circuit board 500, and the one side pad 518a and the other side pad 518b provided at the back surface of the circuit board 500.

Each of the through-holes 521a and 521b is a recess portion having a semicircular cross section and penetrates through the circuit board 500, thereby spatially communicating with the slit 504. The inner peripheral surfaces of the through-holes 521 (521a, 521b) are also coated with a conductive material such as a copper film.

Thus, the circuit board 500 also includes the planar pads 516 (516a, 516b) and 518 (518a, 518b) provided with the through-holes 521 (521a, 521b), and the planar pads 513, 514, 515 (515a, 515b) and 517 not provided with the through-holes. In this case as well, the difference between the presence and absence of the through-hole is determined by the magnitude of the current flowing through the planar pads 513 to 518. When the current is large, the through-holes 521 (521a, 521b) are provided to ensure high conductivity.

In the circuit board 500, a plurality of electronic components 511 are mounted along the vertical direction (arrow a and b directions) with respect to both side end parts in the longitudinal direction. This is because, as in the circuit board 400, the heat dissipation effect is improved when the electronic components 511 are disposed in the exposed state in the air flow channel generated by the blades 212 of the impeller 210.

The circuit boards 400 and 500 with such configurations are disposed so as to form a cross shape with each other, and the slits 404 and 504 opposing each other are slidably engaged with each other to be combined. Consequently, a cross-shaped integral board 600 (FIGS. 6A and 6B) composed of the circuit boards 400 and 500 is formed.

When the circuit boards 400 and 500 are combined via the slits 404 and 504 in this manner, the inner peripheral surface of the through-hole 421a of the circuit board 400 and the planar pad 513 of the circuit board 500 face each other at a close distance. At the same time, the inner peripheral surface of a through-hole 421b of the circuit board 400 and the planar pad 517 of the circuit board 500 face each other at a close distance.

Similarly, the inner peripheral surface of the through-hole 422 of the circuit board 400 and a planar pad 514 of the circuit board 500 face each other at a close distance. Furthermore, the planar pad 415 of the circuit board 400 and the inner peripheral surface of a through-hole 521b of the circuit board 500 face each other at a close distance.

In this state, the planar pad 413a of the circuit board 400 and the planar pad 513 of the circuit board 500 are mechanically and electrically joined by soldering. At this time, the solder also flows into the through-holes 421a, 421b, and 422 of the circuit board 400 and the through-holes 521a and 521b of the circuit board 500.

Thus, the through-holes 421 (421a, 421b) and 422 of the circuit board 400 and the planar pads 513 and 514 of the circuit board 500 are mechanically and electrically joined by soldering. In addition, the through-holes 521 (521a, 521b) of the circuit board 500 and the planar pad 415 of the circuit board 400 are mechanically and electrically joined by soldering.

At this time, the through-holes (421a, 421b) and 422, and the planar pads 513 and 514 of the circuit board 500 are connected by soldering in a state of facing each other at a close distance, and the amount of solder flowing into the space of the through-holes (421a, 421b) and 422 each having a semicircular cross section is minimal, thereby reducing costs. In addition, since the solder is filled into the space of the through-holes (421a, 421b) and 422 each having a semicircular cross section, the conductivity is further improved and the joint strength is also improved.

In this manner, in the integral board 600, the circuit board 400 and the circuit board 500 are combined in a cross shape through the respective slits 404 and 504, the planar pads in contact with each other are joined by solder, and the planar pads are joined with each other through the through-holes 421, 422 and 521. Thus, the circuit board 400 and the circuit board 500 are firmly connected mechanically and electrically.

The integral board 600 is slidably inserted into the four board insertion grooves 308 formed at the thick portions 306 of the side wall 304 in the lower casing 300, and is held in the lower casing 300 (FIG. 1, and FIGS. 2A and 2B). The integral board 600 may be inserted into and held in the board insertion grooves 308 of the lower casing 300 by press-fitting.

As illustrated in FIG. 7, the circuit boards 400 and 500 of the integral board 600, in a state of being held at the board insertion grooves 308 of the lower casing 300, are disposed so as to overlap linearly with end edges 206a extending in the longitudinal direction of the plurality of the fixed blades 206.

The integral board 600 is formed in the cross shape with a 90 degree gap when the plurality of the fixed blades 206 are provided in an even number at equiangular gaps, so that the circuit boards 400 and 500 and the end edge 206a of the fixed blade 206 can be disposed in a linearly overlapping state.

In practice, in bottom view of the lower casing 300, the circuit boards 400 and 500 of the integral board 600 overlap linearly with the end edges 206a of the fixed blades 206, but this is not limited, and may not necessarily overlap with the end edges 206a, as long as the circuit boards 400 and 500 do not extend beyond the end edges 206a of the fixed blades 206 and do not overlap spatially with the fixed blades 206 (e.g., between the fixed blade 206 and the fixed blade 206).

Thus, the circuit boards 400 and 500 of the integral board 600 do not become an obstruct to the flow of the wind rectified by the blades 212 of the impeller 210, enabling to suppress the reduction in efficiency in the fan device 100.

The lower (arrow b direction) end part and about the lower half of the board surface of the circuit boards 400 and 500 are coated with an insulating resin or the like. This makes the integral board 600 difficult to generate static electricity through the coating process.

In the above configuration, when an excitation current is applied to the coil wound around the stator part 260 of the motor 250 by the motor drive control circuit of the integral board 600, the rotor yoke 271 rotates, and then the impeller 210 coupled with the rotor yoke 271 rotates as the rotor yoke 271 rotates. Thereby the fan device 100 functions as a fan.

At this time, air taken in from the intake opening 201 of the upper casing 200 at the upstream side by the rotation of the impeller 210 becomes wind and is discharged from the exhaust opening 301 of the lower casing 300 at the downstream side. The circuit boards 400 and 500 of the integral board 600 are combined and accommodated in a cross shape in the inner space of the lower casing 300, and the electronic components 411 and 511 generating a large amount of heat are exposed in the flow channel, so efficient cooling is possible.

In the fan device 100, the circuit boards 400 and 500 are disposed so that the board surfaces are aligned with the axis X being the rotational axis of the impeller 210, with respect to the lower casing 300 at the downstream side.

Although the mounting area is almost doubled by using two circuit boards 400 and 500 to increase output of the fan, this allows the fan device 100 to efficiently cool all the electronic components 411 and 511 of the circuit boards 400 and 500 without increasing the size of the casing 150 (upper casing 200 and lower casing 300).

Furthermore, in the fan device 100, the circuit board 400 and circuit board 500 of the integral board 600 are combined via the slits 404 and 504, and also the circuit boards 400 and 500 are firmly coupled mechanically and electrically because the planar pads are connected to each other by solder. Additionally, in the fan device 100, the planar pads are joined to each other through the through-holes 421, 422 and 521 of the circuit boards 400 and 500, so that the joining strength is further improved along with the improvement of the conductivity.

Other Embodiments

In the fan device 100 in the above-described embodiments, the circuit boards 400 and 500 in a cross shape in the integral board 600 held by the lower casing 300 have been described, but the disclosure is not limited to this, and as illustrated in FIGS. 8A to 8E, a plurality of circuit boards may be held by the lower casing 300 along the axis X by various other combinations.

As illustrated in FIG. 8A, an integral board 1500 with circuit boards 1100, 1200 and 1300 triangularly combined and with the board surfaces lined in parallel along the axis X, may be held by the board insertion grooves 308 of the lower casing 300. In this case, one end parts of the respective circuit boards 1100 and 1200 are combined via slits respectively provided, and the other end parts of the respective circuit boards 1100 and 1200 and both end parts of the circuit board 1300 are combined integrally by adhesion, fitting, or the like. In the integral board 1500, as in the integral board 600, electronic components are disposed at both end parts of the circuit board 1300 in the longitudinal direction. However, since the circuit boards 1100 and 1200 are disposed along the side wall 304 away from the axis X, and the board itself is disposed in the flow channel of the wind generated by the impeller 210, the electronic components may be disposed over the entire range of the board. Thus, in the integral board 1500, the mounting area of the electronic components can be increased to three boards, and all the electronic components exposed and disposed in the flow channel of the wind generated by the impeller 210 are efficiently cooled.

As illustrated in FIG. 8B, an integral board 2500 with circuit boards 2100, 2200, 2300, and 2400 combined in a substantially square shape and with the board surfaces lined in parallel along the axis X, may be held by the board insertion grooves 308 of the lower casing 300. In this case, the four circuit boards 2100, 2200, 2300, and 2400 are combined integrally via the slits respectively provided. In this integral board 2500, the mounting area of the electronic components can be increased to four boards, and all the four boards are disposed in the flow channel of the wind generated by the impeller 210. Thus, the electronic components may be disposed over the entire range of the board, and all the electronic components are efficiently cooled by the wind generated by the impeller 210.

As illustrated in FIG. 8C, an integral board 3500 with circuit boards 3100, 3200 combined and in a substantial L-shape and with the board surfaces lined in parallel along the axis X, may be held by the board insertion grooves 308 of the lower casing 300. In this case, the circuit boards 3100 and 3200 are combined via the slits provided with each other. In this integral board 3500 as well, since the two circuit boards 3100 and 3200 are disposed in the flow channel of the wind generated by the impeller 210, the electronic components may be disposed over the entire range of the board. Thus, in the integral board 3500, the mounting area of the electronic components can be increased to two boards, and further, all the electronic components exposed and disposed in the flow channel of the wind generated by the impeller 210 are efficiently cooled.

As illustrated in FIG. 8D, an integral board 4500 with circuit boards 4100, 4200 and 4300 combined in a substantially U-shape and with the board surfaces lined in parallel along the axis X, may be held by the board insertion grooves 308 of the lower casing 300. In this case, the circuit boards 4100, 4200, and 4300 are combined via the slits provided with each other. In this integral board 4500 as well, since three circuit boards 4100, 4200 and 4300 are disposed in the flow channel of the wind generated by the impeller 210, the electronic components may be disposed over the entire range of the board. Thus, in the integral board 4500, the mounting area of the electronic components can be increased to three boards, and all the electronic components exposed and disposed in the flow channel of the wind generated by the impeller 210 are efficiently cooled.

As illustrated in FIG. 8E, an integral board 5500 with circuit boards 5100 and 5200 combined in a substantial V-shape and with the board surfaces lined in parallel along the axis X, may be held by the board insertion grooves 308 of the lower casing 300. In this case, one end of the circuit board 5100 and one of the circuit board 5200 are combined by bonding or fitting with each other. In the integral board 5500, as with the integral board 600, the electronic components are disposed at both end parts of the circuit board 5200 in the longitudinal direction. However, since the circuit board 5100 is disposed along the side wall 304 away from the axis X, and circuit board 5100 itself is disposed in the flow channel of the wind generated by the impeller 210, the electronic components may be disposed over the entire range of the board. Thus, in the integral board 5500, the mounting area of the electronic components can be increased to two boards, and all the electronic components exposed and disposed in the flow channel of the wind generated by the impeller 210 are efficiently cooled.

As illustrated in FIGS. 9A to 9E, a fan device 7000 includes a lower casing 7300 having a new structure and integrally attached to the upper casing 200 described above in the embodiments. That is, the fan device 7000 differs only in the configuration of the lower casing 7300, so the lower casing 7300 is described here.

In the lower casing 7300, although a frame part 7301 and a lower flange part 7303 are formed as a frame, the side wall 304 (FIGS. 4A to 4C) as in the lower casing 300 is not provided, and four circuit boards 7310, 7320, 7330, and 7340 are used as side walls instead of the side wall 304. As illustrated in FIG. 9D, the circuit boards 7310 and 7330 are each composed of substantially T-shaped board corresponding to the shape of the lower casing 7300, and three engagement opening parts h1 composed of penetrating holes in a rectangular shape in plan view are provided at both end parts along the vertical direction (arrow a and b directions). As illustrated in FIG. 9E, the circuit boards 7320 and 7340 are also each composed of substantially T-shaped board of the same size and shape as the circuit boards 7310 and 7330, and three engagement protruding parts p1 projecting in a rectangular shape in plan view are provided at both end parts along the vertical direction (arrow a and b directions).

In these circuit boards 7310, 7320, 7330 and 7340, the engagement opening parts h1 and the engagement protruding parts p1 are fitted together and form an integral board 7350 in a square shape in plan view. The integral board 7350 is fixed to the lower casing 7300 by various methods such as bonding or fitting instead of a side wall. A joint member 7400 acting as a spacer is interposed between the integral board 7350 and the upper casing 200, and the upper casing 200 and the integral board 7350 are coupled through the joint member 7400.

Copper wire of the coil is connected to the integral board 7350 after extending downward (arrow b direction) along the fixed blades 206 of the upper casing 200. As a result, the occurrence of an extra portion of the copper wire of the coil can be suppressed, whereby defects such as disconnection can be prevented. In addition, all surfaces facing the outside of the integral board 7350 are subjected to surface treatment by potting treatment using resin or the like. Thus, the circuit boards 7310, 7320, 7330 and 7340 of the integral board 7350 can be protected from stress and static electricity caused by contact from the outside.

In the fan device 7000 with this configuration, the joining strength of the integral board 7350 is improved by fitting between a penetrating hole h1 and the protruding portion p1, and the cost and the weight are reduced by not including the side wall 304 like in the lower casing 300.

Additionally, a person skilled in the art may modify the fan devices 100 and 7000 of the disclosure as appropriate and change the combination of various configurations in accordance with known knowledge. Such modifications, as long as still include the configurations of the disclosure, are of course included in the scope of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

The invention claimed is:

1. An axial fan motor, comprising:
   a casing having a hollow tubular shape and provided with an intake opening at one end in an axial direction and an exhaust opening at another end in the axial direction;
   an impeller accommodated in the casing and including a plurality of blades;
   a motor accommodated in the casing and configured to rotate the impeller; and
   a plurality of circuit boards arranged along the axial direction at a side by the exhaust opening in the casing, wherein at least two circuit boards to be combined with each other among the plurality of circuit boards are provided with a slit, and a through-hole is formed around the slit.

2. The axial fan motor according to claim 1, wherein
the plurality of circuit boards are each mounted with an electronic component, and
the electronic component is disposed at each of the plurality of circuit boards in an exposed state in a flow channel formed by the impeller.

3. The axial fan motor according to claim 1, wherein
the casing includes an upper casing and a lower casing integrally coupled, and
the plurality of circuit boards are accommodated inside the lower casing.

4. The axial fan motor according to claim 3, wherein
the plurality of circuit boards are each held by a board insertion groove formed near a corner of the lower casing.

5. The axial fan motor according to claim 4, wherein
the board insertion groove is formed at a thick portion of a flange part formed at the corner of the lower casing.

6. The axial fan motor according to claim 5, wherein
the plurality of circuit boards are held at the lower casing in a state of being joined in a cross shape in plan view.

7. The axial fan motor according to claim 5, wherein
the plurality of circuit boards are held at the lower casing in a state of being joined in a triangle shape in plan view.

8. The axial fan motor according to claim 5, wherein
the plurality of circuit boards are held at the lower casing in a state of being joined in a rectangular shape in plan view.

9. The axial fan motor according to claim 5, wherein
the plurality of circuit boards are held at the lower casing in a state of being joined in an L-shape in plan view.

10. The axial fan motor according to claim 5, wherein
the plurality of circuit boards are held at the lower casing in a state of being joined in a U-shape in plan view.

11. The axial fan motor according to claim 3, wherein
the plurality of circuit boards are used as a side wall for the lower casing.

12. The axial fan motor according to claim 11, wherein
of the plurality of circuit boards, a circuit board forming an engagement opening part and a circuit board forming an engagement protruding part engaged with the engagement opening part are joined together.

13. The axial fan motor according to claim 12, wherein
each of the plurality of circuit boards includes an electronic component mounted only at an exposed surface located at a side exposed to a flow channel formed by the impeller, and an outer surface located at an outer side opposite to the exposed surface is coated.

14. The axial fan motor according to claim 11, wherein in the plurality of circuit boards, a downstream portion of a flow channel formed by the impeller is subjected to a surface treatment by a predetermined potting process.

* * * * *